United States Patent
Yang et al.

(10) Patent No.: US 10,859,611 B2
(45) Date of Patent: Dec. 8, 2020

(54) MEASURING AND MITIGATING CHANNEL DELAY IN REMOTE DATA ACQUISITION

(71) Applicant: Schweitzer Engineering Laboratories, Inc., Pullman, WA (US)

(72) Inventors: Qiaoyin Yang, Bothell, WA (US); Manodev J. Rajasekaran, Pullman, WA (US); Edgar B. Cenzon, Irvine, CA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 338 days.

(21) Appl. No.: 15/988,170

(22) Filed: May 24, 2018

(65) Prior Publication Data

US 2018/0348267 A1    Dec. 6, 2018

Related U.S. Application Data

(60) Provisional application No. 62/515,941, filed on Jun. 6, 2017.

(51) Int. Cl.
*G01R 19/25* (2006.01)
*G01R 19/145* (2006.01)
*G01R 19/252* (2006.01)
*H02J 3/00* (2006.01)
*H02J 13/00* (2006.01)

(52) U.S. Cl.
CPC ....... *G01R 19/2513* (2013.01); *G01R 19/145* (2013.01); *G01R 19/252* (2013.01); *H02J 3/00* (2013.01); *H02J 13/0006* (2013.01); *H02J 2203/20* (2020.01)

(58) Field of Classification Search
CPC ............ G01R 19/252; G01R 19/2513; G01R 19/145; H02J 3/00; H02J 13/0006; H02J 2203/20
See application file for complete search history.

(56) References Cited

U.S. PATENT DOCUMENTS 2,817,024 A    12/1957    Karlicek
7,230,809 B2    6/2007    Whitehead
(Continued)

OTHER PUBLICATIONS

S. Manoharan, et al. "Grid Synchronication by Estimation of Positive Sequence Component in Three Phase Signals", International Journal of Innovative Research in Science, Engineering and Technology, vol. 3, Special Issue 3, Mar. 2014.
(Continued)

*Primary Examiner* — Yoshihisa Ishizuka
(74) *Attorney, Agent, or Firm* — Bradley W. Schield; Richard M. Edge (57) ABSTRACT

Disclosed herein are systems and methods of calculating and mitigating time delays for electric power system samples received by remote data acquisition unit (RDAU), digitized, and transmitted to a receiving intelligent electronic device (IED). The IED may calculate time delays for various RDAUs, and establish wait windows for certain protection operations based on the samples needed for the protection operation and the calculated time delays for the various RDAUs. The IED may detect and report system or time signal anomalies based on changes to the calculated time delays from particular RDAUs.

20 Claims, 6 Drawing Sheets

(56) References Cited

U.S. PATENT DOCUMENTS

| | | | |
|---|---|---|---|
| 7,630,863 B2* | 12/2009 | Zweigle | G01R 19/2513 |
| | | | 702/177 |
| 2005/0280966 A1 | 12/2005 | Whitehead | |
| 2013/0096854 A1 | 4/2013 | Schweitzer | |
| 2014/0036963 A1* | 2/2014 | Dzung | H04B 1/7073 |
| | | | 375/141 |

OTHER PUBLICATIONS

Adrian Vasile Timbus "Grid Monitoring and Advanced Control of Distributed Power Generation Systems" Aalborg: Institut for Energiteknik, Aalborg Universitet. May 2007.

* cited by examiner

MEASURING AND MITIGATING CHANNEL DELAY IN REMOTE DATA ACQUISITION

RELATED APPLICATION

The present application claims the benefit under 35 U.S.C. § 119(e) of U.S. Provisional Patent Application No. 62/515,941, entitled "Measuring and Mitigating Channel Delay in Remote Data Acquisition", filed Jun. 6, 2017, which is herein incorporated by reference in its entirety and for all purposes.

TECHNICAL FIELD

This disclosure relates to measuring and mitigating for channel delay in remote data acquisition. More particularly, this disclosure relates to measuring a channel delay between multiple remote data acquisition units (RDAUs) and an intelligent electronic device (IED), and mitigating for the measured channel delay at the IED.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Electric power delivery systems are used to distribute electric power from electric power generation sources to loads, which may be close or distant from the generation sources. Such systems may include generators or other sources, transformers step up or down voltages, transmission lines, buses, distribution lines, voltage regulators, capacitor banks, reactors, circuit breakers, switches, and other such equipment. Electric power distribution equipment may be monitored, automated and/or protected using intelligent electronic devices (IEDs).

In some systems, IEDs obtain signals from the electric power delivery system via direct connection to current transformers (CTs), potential transformers (PTs), and the like. Such IEDs may be configured with the particular physical and electrical parameters of the connected CTs and/or PTs, and may further include sampling hardware and software for converting the analog signals to digitized analog signals useful for determining a state of the electric power delivery systems. In other systems, RDAUs may be in electrical communication with the CTs and PTs, and configured to sample and digitize the signals from the CTs and PTs, and provide digitized electrical signals corresponding with the sampled analogs to connected IEDs. Failure of the RDAU and/or the communication system between the RDAU and the IED may result in a failure of the IED to obtain signals necessary for monitoring the electric power delivery system. What is needed is a system for providing appropriate digitized analog signals to subscribing IEDs even upon failure of the RDAU and/or communication system.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

Systems and methods described below are related to mitigating channel delay in power delivery systems. In a first embodiment, a system for providing electric power system signals to receiving intelligent electronic devices (IEDs) includes a first remote data acquisition unit (RDAU) in electrical communication with an electric power delivery system. The first RDAU may obtain electrical signals from the electric power delivery system, create digitized electrical signals from the obtained electrical signals, time stamp the digitized electrical signals according to a common time reference, and transmit the time stamped digitized electrical signals over a first communication path. A second RDAU in electrical communication with the electric power delivery system may obtain electrical signals from the electric power delivery system, create digitized electrical signals from the obtained electrical signals, time stamp the digitized electrical signals according to a common time reference, and transmit the time stamped digitized electrical signals over a second communication path. The system includes an IED that receives the common time reference. The IED may receive the time stamped digitized electrical signals from the first RDAU via the first communication path and the time stamped digitized electrical signals from the second RDAU via the second communication path. The IED may calculate a first time delay for the first communication path as a time delay from the sampling of the signal by the first RDAU to the receipt of the time-stamped digitized electrical signal at the IED. The IED calculates a second time delay for the second communication path as a time delay from the sampling of the signal by the second RDAU to the receipt of the time-stamped digitized electrical signal at the IED. The IED may establish a sample delay window for a predetermined protection operation based on the first time delay and the second time delay. The IED may continue receiving samples during the sample delay window. The IED may, upon lapse of the sample delay window, time align the samples received during the sample delay window. The IED may perform a protection operation using the time aligned samples received during the sample delay window.

Figure 1A:
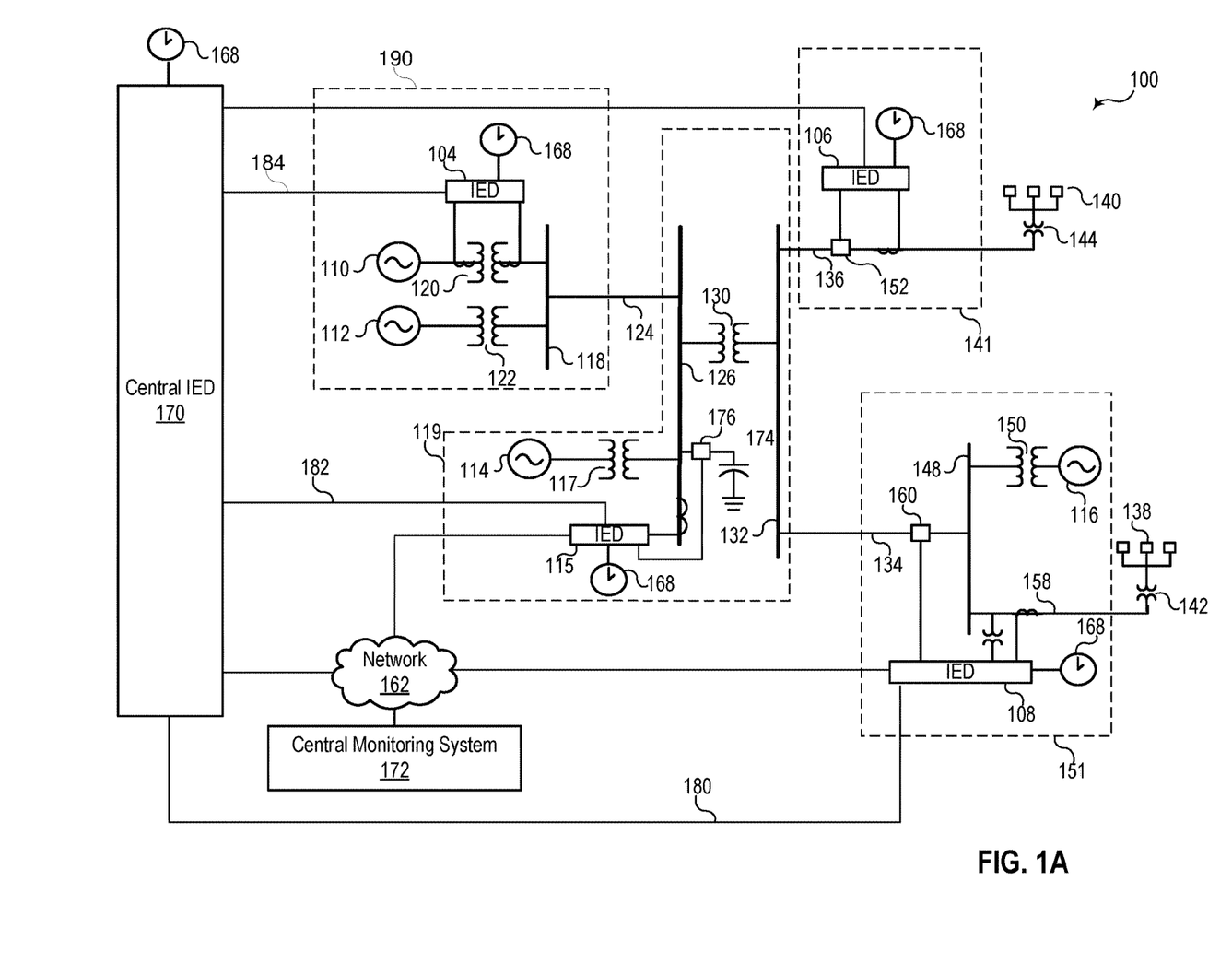
FIG. 1A illustrates a simplified one-line diagram of an electric power transmission and distribution system with an accompanying monitoring system.

FIG. 1A illustrates a simplified one-line diagram of an alternating current electric power transmission and distribution system 100 consistent with embodiments of the present disclosure. Electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 142, 144 and 150), power transmission and delivery lines (e.g., lines 124, 134, 136, and 158), circuit breakers (e.g., breakers 152, 160, 176), busses (e.g., busses 118, 126, 132, and 148), loads (e.g., loads 140, and 138) and the like. A variety of other types of equipment may also be included in electric power delivery system 100, such as voltage regulators, capacitor banks, and a variety of other types of equipment.

Substation 190 may include two generating sources 110, 112 feeding bus 118 via transformers 120, 122. Transformer 120 may be monitored and protected using IED 104.

Substation 119 may include a generator 114, which may be a distributed generator, and which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further step-down transformer 144 in communication with distribution bus 132 via distribution line 136 may be used to step down a voltage for consumption by load 140.

Distribution line 134 may lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, digital sample publishing units, merging units, and the like. The term IED may be used to describe an individual IED or a system comprising multiple IEDs.

A common time signal may be distributed throughout system 100. Utilizing a common or universal time source may ensure that IEDs have a synchronized time signal that can be used to generate time synchronized data, such as synchrophasors and sampled values. In various embodiments, IEDs 104, 106, 108, 115, and 170 may receive a common time signal 168. The time signal may be distributed in system 100 using a communications network 162 or using a common time source, such as a Global Navigation Satellite System ("GNSS"), or the like.

According to various embodiments, central monitoring system 172 may comprise one or more of a variety of types of systems. For example, central monitoring system 172 may include a supervisory control and data acquisition (SCADA) system and/or a wide area control and situational awareness (WACSA) system. Central monitoring system 172 may be configured to provide protective operations for the system 100. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

In various embodiments, IEDs 104, 106, 108, 115, and 170 may be configured to monitor the frequency of alternating current waveforms in system 100. The measurements may be used in connection with the systems and methods disclosed herein for control of system 100. The IEDs may utilize common time source 168 to time-align measurements for comparison across system 100.

Network 162 may be used to transmit information among various components in system 100, including IEDs 108, 115, 170, and central monitoring system 172. In order to increase reliability, network 162 may include redundant communication paths between communicating devices. Such redundant paths may be selectively enabled when a first communication path is unavailable or disabled. Network 162 may include a variety of devices (e.g., multiplexers, routers, hubs, gateways, firewalls, switches, etc.) and technologies (e.g., connectionless communication network, SDN networks, etc.)

Measurements made by IEDs 104, 106, 108, and 115 may be communicated to central IED 170 and/or central monitoring system 172. In some embodiments, one or more of IEDs 108 and 115 may be configured to send a confirmatory signal through network 162 to central IED 170. In the illustrated embodiment, central IED 170 is in contact with IEDs 108 and 115 via analog communication channels 180 and 182, respectively.

In several embodiments, IEDs may obtain electric power delivery system signals via RDAUs. RDAUs may be in electrical communication with primary equipment (via, for example, current transformers (CTs) and/or potential transformers (PTs) or the like) and configured to receive electric power system signals therefrom and create digitized electric power system signals for IEDs. Such digitized electric power system signals may be digitized analog signals. The digitized analog signals may be packetized and transmitted to the subscribing IED. The RDAUs may communicate the digital samples to the subscribing IEDs as "Sampled Values" ("SVs"). RDAUs may further be configured to provide control signals to primary equipment on the electric power delivery system. For example, an RDAU may be in communication with a circuit breaker, and designed to open and/or close the circuit breaker upon receipt of a command from an IED.

RDAUs may include an input for receiving electrical signals from CTs, PTs, or the like, and digitizing such electrical signals for use by IEDs. To that end, RDAUs may comprise an analog-to-digital converter configured to sample and digitize the incoming analog signals and provide the digitized signals. The RDAU may further comprise a processing module configured to organize the digitized signals into communication packets, and communicate the packetized digitized signals directly to a subscribing IED or to a communication system configured to transmit the packetized digitized signals to a subscribing IED.

Figure 1B:
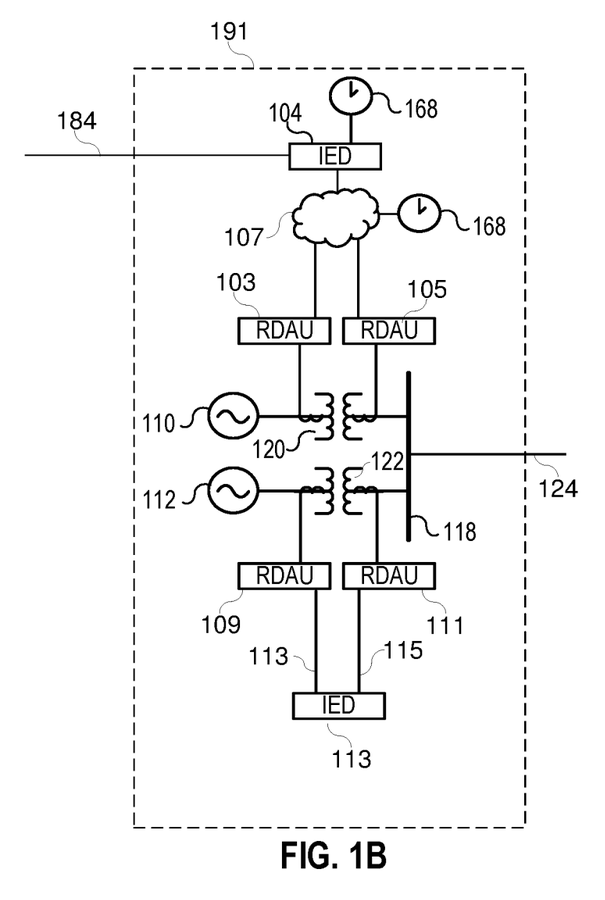
FIG. 1B illustrates an alternative portion of the electric power transmission and distribution system of FIG. 1A, with an accompanying monitoring system.

FIG. 1B illustrates an alternative portion of the electric power transmission and distribution system of FIG. 1A, with an accompanying monitoring system. In particular, FIG. 1B illustrates substation 191, which may be used in the place of substation 190 of FIG. 1A. Substation 191 may include RDAUs 103 and 105 in electrical communication with transformer 120, RDAUs 103 and 105 configured to obtain analog electrical signals via CTs. The RDAUs 103 and 105 may sample and digitize the obtained analog electrical signals and transmit the digitized analog signals to IED 104. The signals may be sent via network 107 to IED 104. A common time signal 168 may be distributed to RDAUs 103 and 105 via network 107. In various embodiment, the common time signal 168 may be distributed to IED 104 via the network, whereas in other embodiments IED 104 may separately receive common time signal 168.

Generator 112 may provide electrical energy to bus 118 via transformer 122. RDAUs 109 and 111 may obtain electrical signals from both sides of transformer 122 via, for example, CTs. RDAUs 109 and 111 may sample the analog signals and send digitized analog signals to IED 113. As illustrated, RDAUs 109 and 111 may be in direct communication with IED 113. In various embodiments, RDAUs 109, 111 may communicate with IED 113 via a network. Although not separately illustrated, RDAUs 109 and 111, and IED 113 may receive a common time signal, such as, for example, time signal 168.

The RDAUs, network(s), and IEDs of substation 191 may communicate according to various protocols. In one embodiment, the various devices may communicate according to a direct process bus protocol, PROFIBUS, fieldbus, or the like. For example, communication lines 113 and 115 may be point-to-point process bus communication channels.

Figure 2:
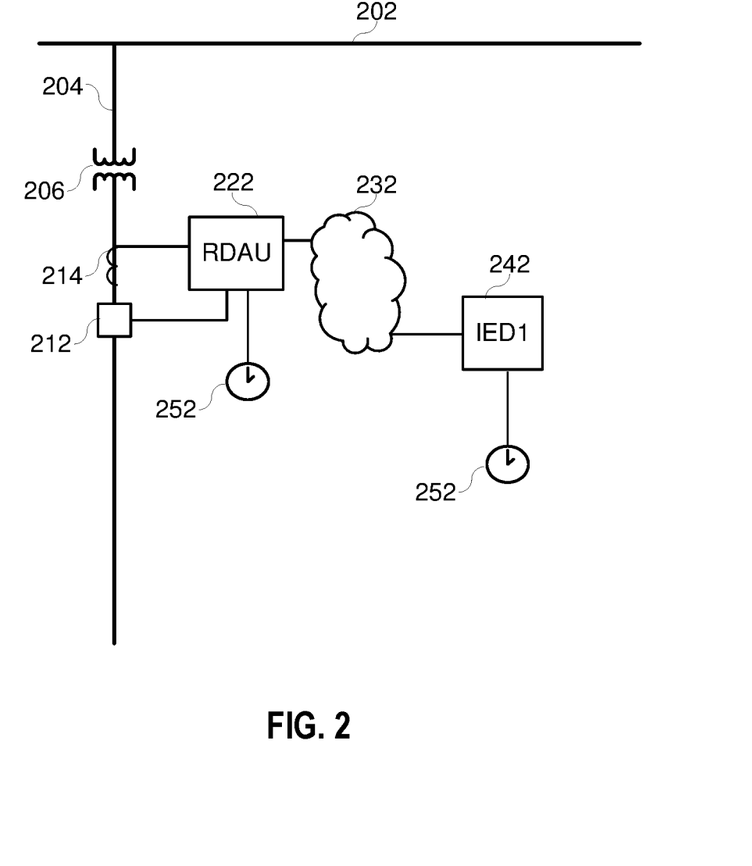
FIG. 2 illustrates a simplified one-line diagram of a system for protecting a zone of an electric power delivery system using RDAUs.

FIG. 2 illustrates a simplified one-line diagram of a portion of an electric power delivery system, and the IEDs that may be used to monitor and protect the portion of the electric power delivery system. The electric power delivery system may include a power line 202 and a feeder 204 connected thereto. The feeder 204 may include a transformer 206 configured to step down the electrical potential on the feeder 204. The feeder 204 may further include a circuit breaker 212 that may be configured to open and/or close on command, to disconnect or connect the remaining portion of the feeder 204 from downstream portions of the electric power delivery system.

Feeder 204 may be monitored and protected by a IED 242, which may be located local to the feeder 204 or remotely from the feeder 204. The IED 242 may be configured to monitor and protect a first portion of the electric power system on a first side of the circuit breaker 212. To monitor and protect the first portion of the electric power delivery system, the IED 242 may obtain electrical information from the electric power delivery system from an RDAU 222. The RDAU 222 may obtain electric signals from the first portion of the electric power delivery system using, for example, CT 214. The RDAU 222 may be configured to obtain electric power signals using CT 214, sample and digitize the electric power system signals, packetize the digitized signals, and transmit the packets to the IED 242 via a communication network 232.

The RDAU 222 may be in communication with a common time signal 252. The common time signal 252 may be a signal such as the common time signal 168 of FIG. 1. The RDAU 222 may include a time stamp provided by the common time signal 252 with samples provided to the IED 242.

The IED 242 may be configured to receive measurements from the RDAU 222 via a communications network 232. The communications network 232 may comprise simply a switch, or be as complex as a network of communications switching devices. IED 242 may be in communication with the common time source 252 to receive a common time signal therefrom. IED 242 may be further configured to determine electric power system conditions using measurements provided by the RDAU 222, and send signals to the RDAU 222 to operate the circuit breaker 212 upon determination of predetermined electric power system conditions.

In various embodiments, the 222 may be configured to receive sampling instructions from IED 242. That is, IED 242 may indicate when samples are to be taken by RDAU 222 and transmitted to IED 242. However, samples may be expected at a certain time by IED 242, but delayed due to the communications system 232 and sampling overhead in RDAU 222.

Although an RDAU 222 is illustrated in FIG. 2, any device capable of receiving commands, sampling, and transmitting a digitized analog signal representing the sample is considered. Such devices may be in the form of RDAUs, sampled values publishers, merging units, IEDs, or the like. The RDAU can have a point-to-point or point-to-multipoint connection with the IEDs, although illustrated in FIG. 2, RDAU 222 is in communication with a single IED 242 for simplicity. The RDAU measures the analog signals and converts the samples into digital samples. The conversion process results in a time delay. These digital samples are published periodically and travel through point-to-point or point-to-multipoint networks to the IEDs and this also results in a time delay. The sum of these two delays may be termed a total network delay herein.

In one embodiment, IED 242 may calculate the total network delay. For this calculation, the IED 242 may first detect that the RDAU 222 and the IED 242 are both time-synchronized to the same high accuracy time source 252. If a common time source is detected (also referenced as "coupled clock mode"), the IED 242 will start measuring the total network delay. RDAU 222 will send messages that include analog data measurements, the time that the measurement is taken and may also include time synchronization status of the RDAU 222. These timestamps can be in the form of actual timestamps or in the form of an integer that represent the time slots in a second. For example, if a second is divided into 1000 slots, each time slot represents 1 ms. Slot index 0 represents the top of a second. Slot index 499 represents 500 ms in a second. If the incoming timestamps are in the form of a human readable timestamp, the IED 242 compares its local time to the timestamp and calculates the time delay, which is the total network or total channel delay. If the incoming timestamps are the form of an integer, the IED 242 derives a number that represents its current time slots and it compares its own value to the incoming integer. The difference can then be converted back into the total network delay.

One particular embodiment complies with the IEC 61850 9-2 Sampled Values Relay standard. In this embodiment, the IED 242 may be a sampled values relay that periodically receives samples from the RDAU 222 in the form of a remote sampled values publisher. The publisher 222 sends each sample with a smpCnt attribute. These samples go through a network 232. This smpCnt attribute is an integer that represents the interval in which the publisher 222 took the sample. To measure the total network delay, IED 242 also calculates its local smpCnt. In one embodiment, the sampling frequency may be 4000 Hz. If IED 242 locally derived smpCnt is 5 and the incoming smpCnt in the Sampled values messages is 2, the channel delay can be calculated as (5−2)*1 second/sampling frequency (4000) =0.75 ms. Another method of calculating the total network delay is to convert the received smpCnt into the absolute time and then compare with the local IED time. The time difference calculated is the total network delay.

This information can be reported via request-response sequences such as ASCII commands. In several embodiments, system-wide channel delays can be reported and graphically visualized. An IED can use communication protocols such as IEC 61850 MMS, DNP3, and other SCADA protocols to send its measured channel delays to an HMI or SCADA. With some HMI designs, an operator can monitor the channel delays in the entire communication system.

Figure 3:
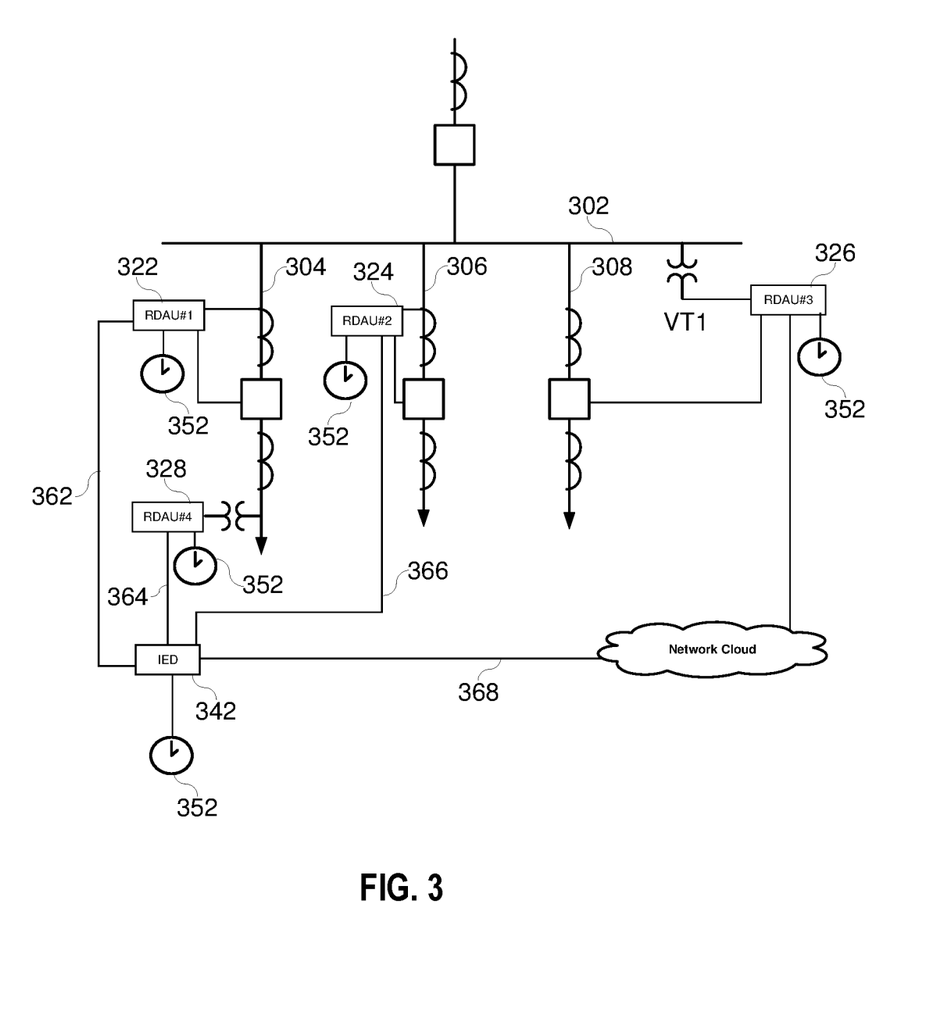
FIG. 3 illustrates a simplified one-line diagram of a system for protecting a zone of an electric power delivery system using RDAUs.

FIG. 3 illustrates a simplified one-line diagram of calculation and mitigation of channel delays for system that includes multiple RDAUs reporting to a single IED. The electric power system of FIG. 3 includes a power line and a bus 302 in connection with three feeders 304, 306, and 308. A first RDAU 322 is in electrical communication with feeder 304 via a CT to obtain current measurements therefrom. A second RDAU 324 is in electrical communication with feeder 306 via a CT to obtain current measurements therefrom. A third RDAU 326 is in electrical communication with the bus 302 via a PT to obtain voltage measurements therefrom. A fourth RDAU 328 is in electrical communication with the first feeder 304 via a PT to obtain voltage measurements therefrom. The first RDAU 322 is in communication with IED 342 via communications line 362. The second RDAU 324 is in communication with IED 342 via communications line 366. The third RDAU 326 is in communication with IED 342 via communications network and communications line 368. The fourth RDAU 328 is in communication with IED 342 via communications line 364.

Each RDAU 322-328 and IED 342 receive a common time signal such as common time signal 352.

As illustrated, each RDAU 322-328 has different communications pathways to IED 342. Accordingly, it is likely that each RDAU 322-328 has different communications and network delays to IED 342, and samples received by IED 342 at a particular time from RDAUs 322-328 are likely not to be time coordinated according to sampling instant. According to several embodiments herein, IED 342 may calculate a network delay for each RDAU 322-328, and mitigate for the varying sampling instant. IED 342 may calculate the total network delay for each RDAU 322-328 according to the embodiments described above.

In one embodiment, the first RDAU 322 digital samples travel on path 362 and this results in a time delay of AT1. These samples include the current measurements. Samples from fourth RDAU 328 travel on path 364 and this results in a time delay of AT2. These samples may include A phase voltage. Samples from the third RDAU 326 travel on path 368 which may include a network and this results in a time delay of AT3. These samples include 3 phase voltage measurements. IED 342 may perform protection operations such as, for example, distance Mho element protection using digitals samples from RDAU 322 and RDAU 326. To ensure the Mho element impedance calculation, voltage and current must come from the same time instance, the channel delay asymmetry between communication path 362 and communication path 368 is accommodated and samples are aligned.

IED 342 measures the delays for path 362 and path 368 using the embodiments disclosed herein. To mitigate for differences in the total network delay for the various RDAUs, IED 342 may determine a wait time and wait for the determined wait time for samples from different RDAUs to arrive, and then align the samples from the same time instance for use by various protection elements. This determined wait window may be calculated as greater than AT1 and AT3 (the total network delays for the communication paths for the specific operation).

According to several embodiments, different wait windows may be established for different protection operations, depending on which samples are needed for the various protection operations. For example, a differential operation may require current measurements from two RDAUs. The wait window for the specific differential operation may be determined based on the total network delays for only those two RDAUs. Where, in the same IED, a protection operation may include bus protection requiring current samples from each feeder attached to the bus and voltage samples from the bus. The IED may be configured to establish a wait window for the bus protection operation based on the total network delays of the RDAUs providing the various current measurements from each feeder and the voltage from the bus. The IED may be configured to provide both protection operations, each with different wait windows for samples from different IEDs. The IED may be configured to provide any number of monitoring, automation, and protection operations, and establish different wait windows for each of the various monitoring, automation, and protection operations.

Setting a wait window may be performed by the IED 342 according to the following. The wait window can be dynamically set or fixed. If it is fixed, it is set to be greater than the maximum of ($\Delta T1, \Delta T2, \ldots \Delta Tn$). This value can be estimated or calculated by users. $\Delta Tn$ represents the channel delays of the nth stream of digital samples. When setting dynamically, the IED first sets its delay to be a much larger number such as 10 ms. The IED then measures the delay for different digital sample streams. In this specific example, the IED 342 will measure the delay for communications channels 362, 364, 366, and 368. The IED then sets its wait window to be slightly greater than max ($\Delta T1, \Delta T2, \ldots \Delta Tn$). Thus, it will be able to align the digital samples from the same time instance before using these samples for protection. It should be noted, if using a fixed network delay, a protection element's operating time will be delayed by this fixed network delay. If the network path changes due to Parallel Redundancy Protocol (PRP), High Availability Seamless Redundancy (HSR) networks, or any other reasons, such that the measured channel delay is greater than the maximum threshold, the IEDs alarm the system operator regarding the significant changes in network path delay. The IEDs can be configured to continue the protection operations or disable protection upon these scenarios.

In another embodiment, the channel delay measurements may be used to identify misbehaving time synchronization sources/clocks and fine tune network paths. The IED 342 of FIG. 3 may receive digital samples streams from multiple RDAUs 322, 324, 326, 328. Each RDAU 322-328 is time synchronized by a time source 352. Each digital sample includes the analog measurements, the time that the measurement is taken and the time synchronization status of the RDAU. A time synchronization status may include whether the local time of the RDAU 322, 324, 326, and 328 is synchronized to the time source 352, whether accuracy of the local clock is within an expected limit, the type of clock source 352 being used, accuracy of the local clock, or the like.

The IED 342 monitors the time synchronization status of each incoming digital stream for changes in channel delay. The IED 342 reports a much longer or a sudden change channel delay for the digital data stream. For example, if the channel delay from RDAU 326 undergoes a large and/or sudden channel delay change, but RDAU 326 has the same time synchronizations status as other RDAUs, then IED 342 may determine an error in time synchronization status, and report the error. The reported channel delays help engineers to identify misbehaving time synchronization/clocks or misbehaving network communications giving that the RDAUs are the same. If it is an issue of the network paths, with the reported channel delay measurements, the communication network may be reconfigured based on the reported channel delays. This helps minimize delays in protection decisions contributed by the total channel delay.

A specific example is the IEC 61850 samples values network. If an IED receiving 5 IEC 61850 9-2 SV streams from multiple RDAUs and these RDAUs are the same, the IED reports a sudden change of the channel delay of an SV stream, network engineers can first check the clock. If it is not an issue of the clock, engineers can start investigating the network path. The network path can include one or more switches. Engineers will need to identify the exact issues and fine tune the network path. Smaller channel delays help minimize delays in protection decisions contributed by the total channel delay.

Figure 4:
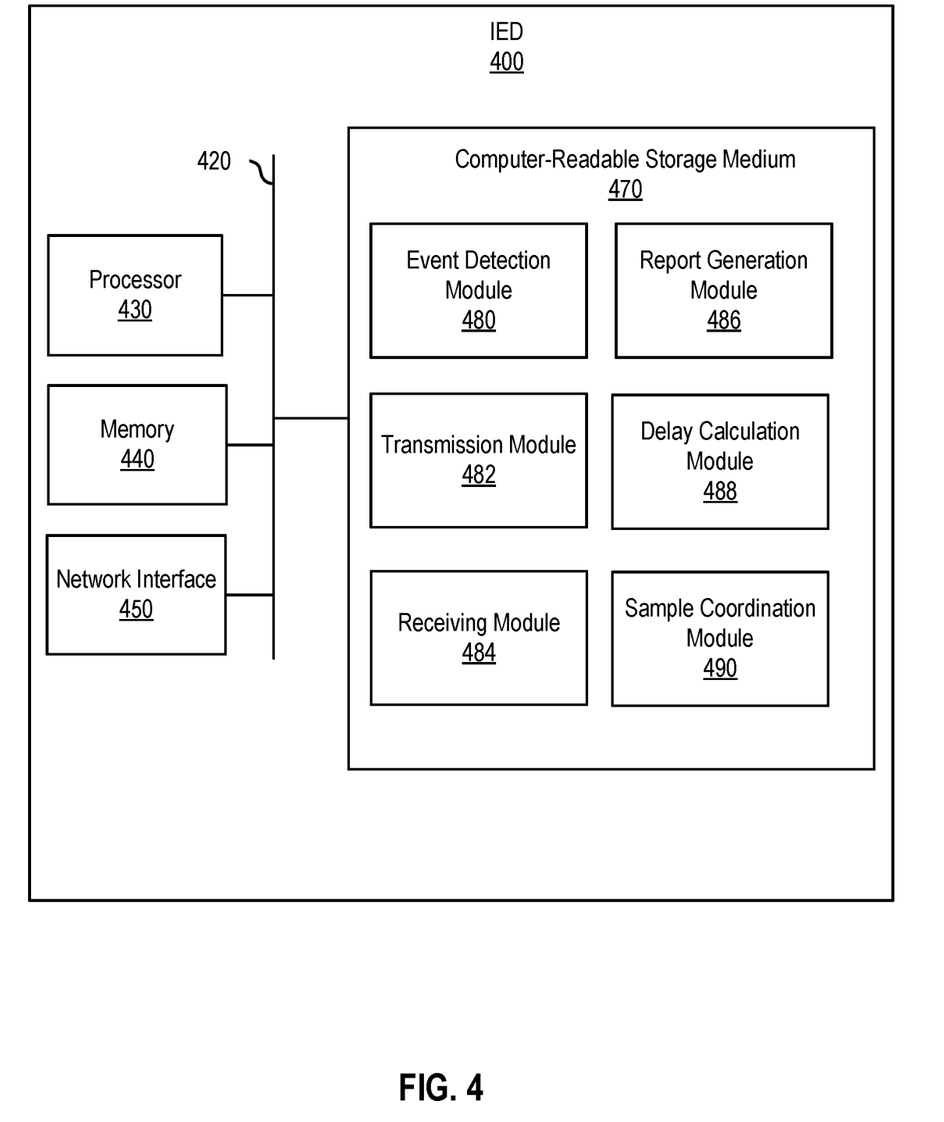
FIG. 4 illustrates an example of an intelligent electronic device according to one embodiment.

FIG. 4 illustrates an embodiment of an IED 400. The IED 400 includes a bus 420 connecting a processor 430 or processing unit(s) to a memory 440, a network interface 450, and a computer-readable storage medium 470. The network interface 450 may include communications circuitry (e.g., transceiver) to communicate with RDAUs, a central monitoring station, or other IEDs. The computer-readable storage medium 470 may include or interface with software, hardware, or firmware modules for implementing various portions of the systems and methods described herein. The separation of the modules is merely an example, and any combination of the modules or further division may be possible.

The computer readable storage medium 470 may include an event detection module 480 configured to detect an occurrence of a predetermined electrical event within a portion of an electrical power delivery system and communicate the occurrence with other IEDs within the electrical power delivery system. The medium 470 may also include a transmission module 482 configured to generate and transmit communications to other monitoring IEDs within the electrical power delivery system, wherein each of the plurality of monitoring IEDs is configured to monitor a distinct portion of the electrical power delivery system, a SCADA system, or the like. The medium 470 may further include a receiving module 484 configured to receive communications from each of the plurality of the signal processing devices reporting to the IED 400. The communications may include time stamps from the signal processing devices. Additionally, the medium 470 may include a report generation module 486 configured to generate a system-wide event report based on the received communications and detected events.

The computer-readable storage medium 470 may include a delay calculation module 488 configured to calculate a channel delay for each of the signal processing devices reporting to the IED 400 using the various embodiments described herein. The computer readable storage medium 470 may further include a sample coordination module 490 in communication with the delay calculation module 488 and the event detection module. The sample coordination module 490 may be configured to operate according to the various embodiments described herein to use the calculated channel delays from the delay calculation module 488 coordinate samples from the various signal processing devices, and make such coordinated samples available for the event detection module 480.

Figure 5:
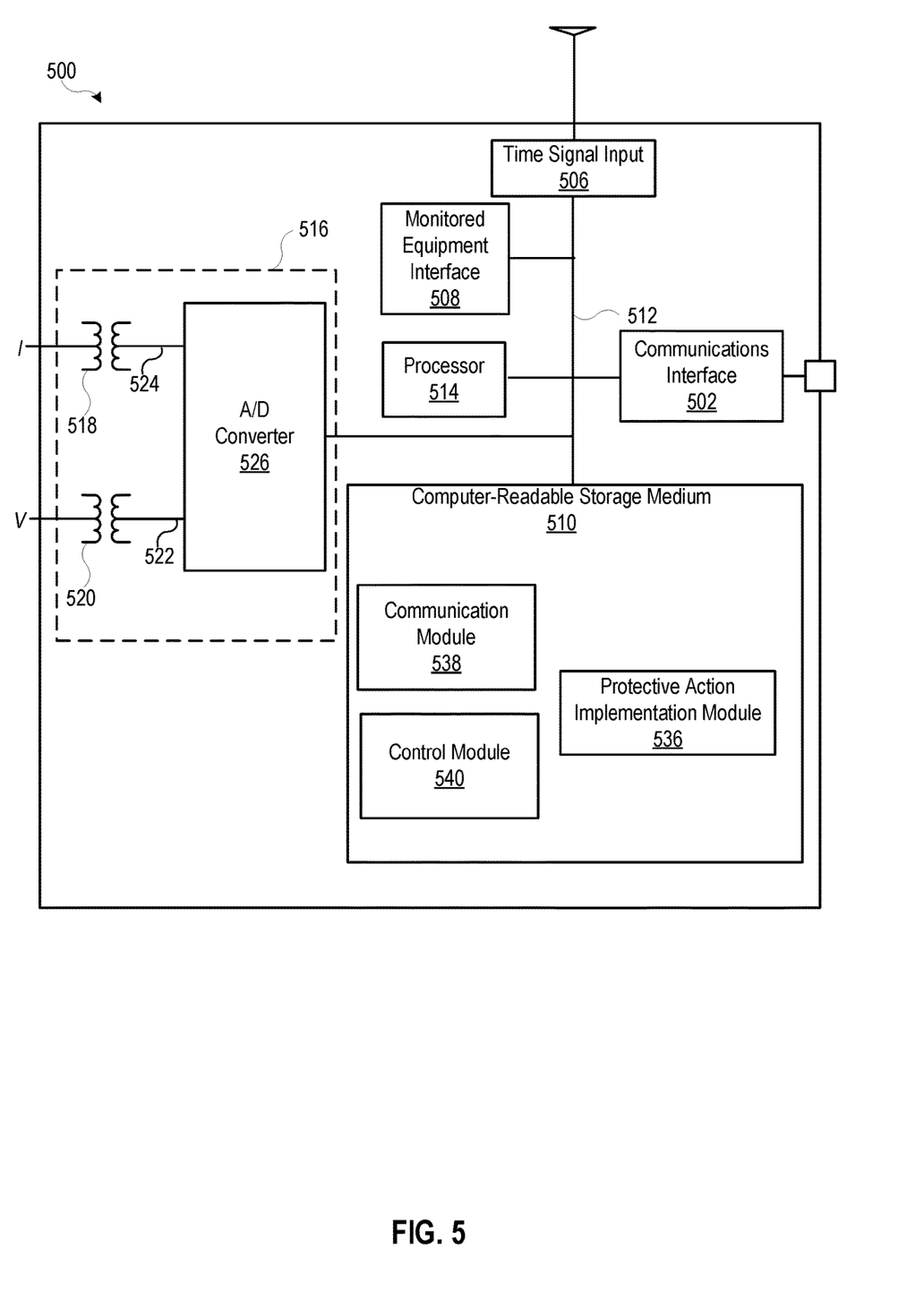
FIG. 5 illustrates a functional block diagram of an embodiment of an RDAU according to one embodiment.

FIG. 5 illustrates a block diagram of a RDAU 500, according to various embodiments disclosed herein. Embodiments of the RDAU 500 may be utilized to implement the systems and methods disclosed herein. For example, the RDAU 500 may be configured to receive analog signals from a portion of a power system, sample the analog signals, and communicate digitized analog signals to subscribing IEDs; and take actions as directed by an IED.

The RDAU 500 may include a communications interface 502 configured to communicate with an IED. The communications may be via a communications network or direct communications as described in more detail herein. The communications interface 502 may include a separate communications interface to communicate with one or more IEDs, to transmit the digitized analog signals.

The RDAU 500 may also include a time input 506, which may be used to receive a time signal. The time input may receive the common time signal. In certain embodiments, a common time reference may be received via the time input 506 or communications interface 502. One such embodiment may employ the IEEE 1588 protocol.

A monitored equipment interface 508 may be configured to receive equipment status information from, and issue control instructions to a piece of monitored equipment, such as an electrical generator, breaker, voltage regulator controller, and/or the like. According to various embodiments, the monitored equipment interface 508 may be configured to interface with a variety of equipment of an electric power delivery system.

A computer-readable storage medium 510 may be the repository of one or more modules and/or executable instructions configured to implement any of the processes described herein. In some embodiments, the computer-readable storage medium 510 and the modules therein may all be implemented as hardware components, such as via discrete electrical components, via an FPGA, and/or via one or more ASICs.

In the illustrated embodiments, a data bus 512 may link a monitored equipment interface 508, the communications interface 502, the time input 506, and/or the computer-readable storage medium 510 to a processor 514.

The processor 514 may be configured to process communications received via the communications interface 502, the time input 506, and/or the monitored equipment interface 508. The processor 514 may operate using any number of processing rates and architectures. The processor 514 may be configured to perform various algorithms and calculations described herein using computer executable instructions stored on computer-readable storage medium 510. Processor 514 may be embodied as a general purpose integrated circuit, an application specific integrated circuit, a field-programmable gate array, and/or other programmable logic devices.

In certain embodiments, the RDAU 500 may include a sensor component 516. In the illustrated embodiment, the sensor component 516 is configured to gather data from a location of the electric power delivery system (not shown) using a current transformer 518 and/or a voltage transformer 520. The voltage transformer 520 may be configured to step-down the power system's voltage (V) to a secondary voltage waveform 522 having a magnitude that can be readily monitored and measured by the RDAU 500. Similarly, the current transformer 518 may be configured to proportionally step-down the power system's line current (I) to a secondary current waveform 524 having a magnitude that can be readily monitored and measured by the RDAU 500. Although not separately illustrated, the voltage and current signals V and I may be secondary signals obtained from equipment instruments designed to obtain signals from power system equipment. For example, a secondary voltage signal V may be obtained from a potential transformer (PT) in electrical communication with a conductor. A secondary current signal I may be obtained from a current transformer (CT) in electrical communication with a conductor. Various other instruments may be used to obtain signals from electric power delivery systems including, for example, Rogowski coils, optical transformers, and the like.

An analog-to-digital converter 526 may multiplex, sample and/or digitize the measured voltage and/or current signals to form corresponding digitized current and voltage signals. Similar values may also be received from other distributed controllers, station controllers, regional controllers, or centralized controllers. The values may be in a digital format or other format. In certain embodiments, the sensor component 516 may be utilized to monitor current signals associated with portion of an electric power delivery system. Further, the sensor component 516 may be configured to monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, conductor sag and the like.

The A/D converter 526 may be connected to the processor 514 by way of the bus 512, through which digitized representations of current and voltage signals may be transmitted to the processor 514. As described above, the processor 514 may be used to apply equipment status, measurements, and derived values to an IED module (e.g., the modules in the computer-readable storage medium 510). The processor 514 may be used to monitor and protect portions of an electric delivery system, and issue control instructions in response to the same (e.g., instructions implementing protective actions).

A monitored equipment interface 508 may be configured to receive status information from, and issue control instructions to a piece of monitored equipment. The monitored equipment interface 508 may be configured to issue control instructions to one or more pieces of monitored equipment.

The computer-readable storage medium 510 may be the repository of one or more modules and/or executable instructions configured to implement certain functions and/or methods described herein. For example, the computer-readable storage medium 510 may include a communication module 536 to control communications with the subscribing IED. The communications module 536 may include instructions for formatting and translating communications between the RDAU 500 and the subscribing IED. The communications module 536 may include instructions for assigning a time stamp to communications to the subscribing IED.

The storage medium 510 may also include a protective action implementation module 536 that includes instructions for taking a control action or sending a control instruction via the monitored equipment interface 508 to the primary equipment. In some embodiments, the processor 430 may send, via the communication circuitry, a control signal to control operation of one or more relays, reclosers, or sensors, based at least in part on the time-aligned samples to allow more accurate control of power on power distribution systems to improve reliability of the power distribution system.

The control module 540 may be configured for interacting with monitored equipment connected to distributed controller via the monitored equipment interface 508 and/or via the communications interface 502.

Systems and methods described herein may improve IED technology in power systems by enabling functionality of protection and control operations on power systems based on time aligned samples from different RDAUs, each of which may have different internal clocks. Further, the operation of the IED may be improved by time aligning the samples by more accurately monitoring its remote data acquisitions. Moreover, in some embodiments, IED technology may be improved by adjusting network paths (e.g., path between switches, relays, or other electronic devices on the power system) based on the time delays to improve network efficiency. In this manner, IEDs may assess events on power systems in a more accurate and reliable manner by having time aligned samples, thereby improving stability of the power system. Further, the IED may more accurately control circuit breakers on the power distribution due to the improved functionality of the IED, thereby improving operation of the power distribution system.

This disclosure has been made with reference to various embodiments, including the best mode. However, those skilled in the art will recognize that changes and modifications may be made to the embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

This disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element. The scope of the present invention should, therefore, be determined by the following claims:

What is claimed is:

1. A system for providing electric power system signals to receiving intelligent electronic devices (IEDs), comprising:
   a first remote data acquisition unit (RDAU) in electrical communication with an electric power delivery system, configured to obtain electrical signals from the electric power delivery system, create first digitized electrical signals from the obtained electrical signals, time stamp the first digitized electrical signals according to a common time reference, and transmit the first digitized electrical signals over a first communication path;
   a second RDAU in electrical communication with the electric power delivery system, configured to obtain electrical signals from the electric power delivery system, create digitized electrical signals from the obtained electrical signals, time stamp the second digitized electrical signals according to the common time reference, and transmit the second digitized electrical signals over a second communication path;
   an IED comprising a processor operatively coupled to a memory, wherein the processor is configured to:
   receive the common time reference;
   receive the first digitized electrical signals from the first RDAU via the first communication path and the second digitized electrical signals from the second RDAU via the second communication path;
   calculate a first time delay for the first communication path as a time delay of a first sample from sampling of the electrical signals by the first RDAU to the receipt of the digitized electrical signal at the IED;
   calculate a second time delay for the second communication path as a time delay of a first sample from sampling of the electrical signals by the second RDAU to the receipt of the digitized electrical signal at the IED;
   establish a sample delay window for a predetermined protection operation based on the first time delay and the second time delay;
   receive a second sample from the first RDAU and a second sample from the second RDAU during the sample delay window;
   upon lapse of the sample delay window, time align the second sample from the first RDAU and the second sample from the second RDAU received during the sample delay window; and,
   perform the predetermined protection operation using the time aligned samples received during the sample delay window.

2. The system of claim 1, wherein the IED is further configured to establish a second sample delay window for a second protection operation different from the first protection operation, using the calculated first time delay and calculated second time delay.

3. The system of claim 1, wherein the IED is further configured to:
   continue calculating a third time delay from the second sample of the first RDAU and a fourth time delay from the second sample of the second RDAU;
   compare the third time delay and the fourth time delay with the first time delay and the second time delay for the first and second RDAUs;
   alarm when both a time quality from a RDAU indicates time synchronization and a difference between compared time delays exceeds a predetermined threshold within a predetermined period.

4. The system of claim 1, wherein the sample delay window is a fixed time window as the greatest of the first time delay and the second time delay.

5. The system of claim 1, wherein the sample delay window is a fixed time window set by a user.

6. The system of claim 1, wherein the IED is further configured to dynamically calculate the sample delay window upon calculation of the first time delay and the second time delay.

7. An intelligent electronic device (IED), comprising:
   a communications interface;
   a memory;

a processor operatively coupled to the memory, wherein the processor is configured to:
receive a common time reference;
receive first time stamped digitized electrical signals from a first remote data acquisition unit (RDAU) via a first communication path;
receive second time stamped digitized electrical signals from a second RDAU via a second communication path;
calculate a first time delay from the first communication path as a time delay of a first sample from sampling of electrical signals by the first RDAU to the receipt of the first time-stamped digitized electrical signals at the IED;
calculate a second time delay for the second communication path as a time delay of a first sample from sampling of electrical signals by the second RDAU to the receipt of the second time-stamped digitized electrical signals at the IED;
establish a sample delay window for a predetermined protection operation based on the first time delay and the second time delay;
receive a second sample from the first RDAU and a second sample from the second RDAU during the sample delay window;
upon lapse of the sample delay window, time align the second sample from the first RDAU and the second sample from the second RDAU received during the sample delay window; and,
perform a protection operation using the time aligned samples received during the sample delay window.

8. The IED of claim 7, wherein the processor is configured to dynamically establish the time window based at least in part on a first time delay associated with data from the first RDAU and a second time delay associated with receiving the data from the second RDAU.

9. The IED of claim 8, wherein the first time delay is based on a first total network delay from digitizing the electrical signals into the first sample and routing the first sample through a network and the second time delay is based on a second total network delay from digitizing the electrical signals into the second sample and routing the second sample through the network.

10. The IED of claim 9, wherein the processor is configured to calculate the first total network delay as a difference between a local time at which the first RDAU measured a sample and a time at which the IED received the sample.

11. The IED of claim 7, wherein the processor is configured to determine a channel delay as a difference between a local time at which the first RDAU measured a sample and a time at which the IED received the sample divided by a sampling frequency.

12. The IED of claim 7, wherein the processor is configured to convert a value representing an interval at which the first device measured the sample into a first absolute time.

13. The IED of claim 12, wherein the processor is configured to compare the first absolute time with a local time of the IED to determine a total network delay.

14. The IED of claim 7, wherein the processor is configured to send a total network delay of the first RDAU and a total network delay of the second RDAU to a display to display the total network delay of the first RDAU and the total network delay of the second RDAU.

15. The IED of claim 7, wherein the processor is configured to adjust a network path used to communicate with the first RDAU.

16. A non-transitory, computer-readable medium comprising instructions configured to be executed by a processor of an intelligent electronic device (IED) communicably coupled to a first remote data acquisition unit (RDAU) and a second RDAU, wherein the instructions are configured to be executed by the processor to:
receive a common time reference;
receive first time stamped digitized electrical signals from a first remote data acquisition unit (RDAU) via a first communication path;
receive second time stamped digitized electrical signals from a second RDAU via a second communication path;
calculate a first time delay from the first communication path as a time delay of a first sample from sampling of electrical signals by the first RDAU to the receipt of the first time-stamped digitized electrical signals at the IED;
calculate a second time delay for the second communication path as a time delay of a second sample from sampling of electrical signals by the second RDAU to the receipt of the second time-stamped digitized electrical signals at the IED;
establish a sample delay window for a predetermined protection operation based on the first time delay and the second time delay;
receive a second sample from the first RDAU and a second sample from the second RDAU during the sample delay window;
upon lapse of the sample delay window, time align the second sample from the first RDAU and the second sample from the second RDAU received during the sample delay window; and,
perform a protection operation using the time aligned samples received during the sample delay window.

17. The non-transitory, computer-readable medium of claim 16, comprising instructions to open a circuit breaker based on the time aligned samples received during the sample delay window to perform the protection operation.

18. The non-transitory, computer-readable medium of claim 16, comprising instructions to:
obtain a time synchronization status associated with the first sample; and
report a channel delay based at least in part on the time synchronization status of the first sample.

19. The non-transitory, computer-readable medium of claim 16, comprising instructions to adjust the first communication path for obtaining samples from the first RDAU.

20. The non-transitory, computer-readable medium of claim 16, wherein the sample delay window is a fixed time window as the greatest of the first time delay and the second time delay.

* * * * *